United States Patent
Reid et al.

(10) Patent No.: US 10,580,982 B2
(45) Date of Patent: Mar. 3, 2020

(54) FABRICATION OF CORRELATED ELECTRON MATERIAL DEVICES METHOD TO CONTROL CARBON

(71) Applicant: Arm Limited, Cambridge (GB)

(72) Inventors: Kimberly Gay Reid, Austin, TX (US); Lucian Shifren, San Jose, CA (US)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/200,001

(22) Filed: Nov. 26, 2018

(65) Prior Publication Data
US 2019/0109283 A1    Apr. 11, 2019

Related U.S. Application Data

(62) Division of application No. 15/048,244, filed on Feb. 19, 2016, now Pat. No. 10,170,700.

(51) Int. Cl.
| | | |
|---|---|---|
| *H01L 49/00* | (2006.01) | |
| *H01L 45/00* | (2006.01) | |
| *C23C 16/40* | (2006.01) | |
| *C23C 16/455* | (2006.01) | |

(52) U.S. Cl.
CPC .......... *H01L 49/003* (2013.01); *C23C 16/406* (2013.01); *C23C 16/45527* (2013.01); *C23C 16/45553* (2013.01); *H01L 45/04* (2013.01); *H01L 45/1233* (2013.01); *H01L 45/146* (2013.01); *H01L 45/1616* (2013.01); *H01L 45/1641* (2013.01); *H01L 45/147* (2013.01)

(58) Field of Classification Search
CPC combination set(s) only.
See application file for complete search history.

(56) References Cited

U.S. PATENT DOCUMENTS

| | | |
|---|---|---|
| 7,298,640 B2 | 11/2007 | Chen et al. |
| 7,639,523 B2 | 12/2009 | Celinska et al. |
| 7,778,063 B2 | 8/2010 | Brubaker et al. |
| 7,872,900 B2 | 1/2011 | Paz De Araujo et al. |
| 8,846,443 B2 | 9/2014 | Hong et al. |
| 9,558,819 B1 | 1/2017 | Aitken et al. |
| 9,584,118 B1 | 2/2017 | Dao et al. |
| 9,589,636 B1 | 3/2017 | Bhavnagarwala et al. |
| 2008/0106925 A1 | 5/2008 | Paz de Araujo |
| 2008/0106926 A1 | 5/2008 | Brubaker |
| 2008/0106927 A1 | 5/2008 | Celinska et al. |
| 2008/0107801 A1 | 5/2008 | Celinska et al. |

(Continued)

FOREIGN PATENT DOCUMENTS

| | | |
|---|---|---|
| JP | 2008078509 A1 | 3/2008 |
| WO | 2008058264 A2 | 5/2008 |
| WO | 2009114796 A1 | 9/2009 |

OTHER PUBLICATIONS

U.S. Appl. No. 15/048,244, filed Feb. 19, 2016, 67 pages.

(Continued)

*Primary Examiner* — Fernando L Toledo
*Assistant Examiner* — Valerie N Newton
(74) *Attorney, Agent, or Firm* — Berkeley Law & Technology Group, LLP

(57) ABSTRACT

Subject matter disclosed herein may relate to fabrication of correlated electron materials used, for example, to perform a switching function. In embodiments, precursors, in a gaseous form, may be utilized in a chamber to build a film of correlated electron materials comprising various impedance characteristics.

20 Claims, 12 Drawing Sheets

(56) References Cited

U.S. PATENT DOCUMENTS

| | | |
|---|---|---|
| 2013/0200323 A1 | 8/2013 | Pham et al. |
| 2013/0214232 A1 | 8/2013 | Tendulkar et al. |
| 2013/0285699 A1 | 10/2013 | McWilliams et al. |
| 2014/0030436 A1 | 1/2014 | Knapp |
| 2014/0175355 A1 | 6/2014 | Wang et al. |
| 2016/0028003 A1 | 1/2016 | Wang |
| 2016/0163978 A1 | 6/2016 | Paz De Araujo et al. |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

OTHER PUBLICATIONS

U.S. Appl. No. 15/048,244: Filing Receipt, Mar. 4, 2016, 3 pages.
U.S. Appl. No. 15/048,244: Request for Corrected Filing Receipt, Mar. 9, 2016, 9pages.
U.S. Appl. No. 15/048,244: Filing Receipt, Mar. 18, 2016, 3 pages.
U.S. Appl. No. 15/048,244: Requirements for Restriction/Election, Sep. 23, 2016, 7 pages.
U.S. Appl. No. 15/048,244: Response to Election/Restriction Filed, Nov. 9, 2016, 8 pages.
U.S. Appl. No. 15/048,244: Non-Final Rejection, dated Mar. 2, 2017, 7 pages.
U.S. Appl. No. 15/048,244: Informal or Non-Responsive Amendment, dated Jun. 2, 2017, 15 pages.
U.S. Appl. No. 15/048,244: Notice to the applicant regarding a non-compliant or non-responsive amendment, dated Jun. 7, 2017, 3 pages.
U.S. Appl. No. 15/048,244: Amendment/Req. Reconsideration-After Non-Final Reject, dated Aug. 7, 2017, 16 pages.
U.S. Appl. No. 15/048,244: Notice of Publication, dated Aug. 24, 2017, 1 page.
U.S. Appl. No. 15/048,244: Notice of Allowance and Fees Due, dated Nov. 15, 2017, 8 pages.
U.S. Appl. No. 15/048,244: Notice of Allowance and Fees Due, dated Nov. 29, 2017, 2 pages.
U.S. Appl. No. 15/048,244: RCE, Jan. 16, 2018, 3 pages.
U.S. Appl. No. 15/048,244: Notice of Allowance and Fees Due, dated Mar. 23, 2018, 5 pages.
U.S. Appl. No. 15/048,244: RCE, Jun. 22, 2018, 3 pages.
U.S. Appl. No. 15/048,244: Notice of Allowance and Fees Due, dated Aug. 3, 2018, 5 pages.
U.S. Appl. No. 15/048,244: Amendment after Notice of Allowance, dated Oct. 30, 2018, 7 pages.
U.S. Appl. No. 15/048,244: Response to Amendment under Rule 312, dated Nov. 27, 2018, 2 pages.
U.S. Appl. No. 15/048,244: Issue Notification, dated Dec. 12, 2018, 1 page.
Notification of Transmittal of the International Search Report and the Written Opinion of the International Searching Authority, or the Declaration, dated Apr. 7, 2017, International Application No. PCT/GB2017/050415, 1 pg.
International Search Report, dated Apr. 7, 2017, international Application No. PCT/GB2017/050415, 4 pgs.
Written Opinion of the International Searching Authority, dated Apr. 7, 2017, International Application No. PCT/GB2017/050415, 9 pgs.
Notification of Transmittal of The International Search Report and the Written Opinion of the International Searching Authority, or the Declaration, International Application No. PCT/GB2017/050414, dated May 23, 2017, 1 pg.
International Search Report, International Application No. PCT/GB2017/050414, dated May 23, 2017, 6 pgs.
Written Opinion of the International Searching Authority, International Application No. PCT/GB20171050414, dated May 23, 2017, 9 pgs.
U.S. Appl. No. 15/048,778, filed Feb. 19, 2016, 60 pgs.
Restriction Requirement dated Aug. 26, 2016, U.S. Appl. No. 15/043,773, 10 pgs.
Response as filed Sep. 8, 2016 to the Restriction Requirement dated Aug. 26, 2016, U.S. Appl. No. 15/048,778, 10 pgs.
Non-Final Office Action dated Oct. 4, 2016, U.S. Appl. No. 15/048,778, 15 pgs.
Response as filed Jan. 4, 2017 to the Non-Final Office Action dated Oct. 4, 2016, U.S. Appl. No. 15/048,778, 20 pgs.
Final Office Action dated May 4, 2017, U.S. Appl. No. 15/048,778, 18 pgs.
Response as filed Aug. 4, 2017 to the Final Office Action dated May 4, 2017, U.S. Appl. No. 15/048,778, 17 pgs.
Advisory Action dated Sep. 20, 2017, U.S. Appl. No. 15/048,778, 6 pgs.
Supplemental response as filed Oct. 5, 2017 to the Final Office Action dated May 4, 2017 and Advisory Action dated Sep. 20, 2017, U.S. Appl. No. 15/048,778, 5 pgs.
Non-Final Office Action dated Apr. 13, 2018, U.S. Appl. No. 15/048,778, 23 pgs.
Response as filed Jul. 13, 2018 to the Non-Final Office Action dated Apr. 13, 2018, U.S. Appl. No. 15/048,778, 18 pgs.
Final Office Action, dated Nov. 26, 2018, U.S. Appl. No. 15/048,778, 17 pgs.
RCE Amendment as filed Feb. 26, 2018 in response to the Final Office Action dated Nov. 26, 2018, U.S. Appl. No. 15/048,778, 21 pgs.
Applicant-Initiated Interview Summary, dated Mar. 11, 2019, U.S. Appl. No. 15/048,778, 4 pgs.
Supplemental Response as filed Mar. 22, 2019 to the RCE Amendment filed Feb. 26, 2018, U.S. Appl. No. 15/048,778, 24 pgs.

Atomic Layer Deposition or ALD

200

210 — Expose a substrate, in a chamber, to a first precursor in a gaseous state, the first precursor comprising a transition metal oxide, a transition metal, or any combination thereof, and a first ligand – example is Nickel Cyclopentadienyl or Ni(CP)2 where nickel is the transition metal and CP or cyclopentadienyl is the ligand. (The order of exposure of the transition metal containing precursor and the oxidizing precursor may be reversed)

→

220 — Purge the reactor of the first precursor and byproducts using an inert gas and/or evacuate - example is purge with nitrogen (N2)

→

230 — Expose the substrate to a second precursor in a gaseous state, the second precursor comprising an oxygen, carbon, or nitrogen containing molecule so as to form a first layer of a film (NiO in this example) of the correlated electron material - example of the oxidizer is O2; the choice of oxidizer and/or the flow rate of the oxidizer may change to control the incorporated carbon.

→

240 — Purge the reactor of the second precursor and byproducts using an inert gas and/or evacuate - example is purge with nitrogen (N2)

→

250 — Repeat the exposing of the substrate to the first and second precursors so as to form additional layers of the film of correlated electron material.

FIG. 2A

Chemical Vapor Deposition or CVD

260

Expose a substrate, in a chamber, to two or more precursors that combine before or at the substrate where one precursor contains a transition metal, a transition metal compound or transition metal oxide and a ligand, and the other precursor molecule contains oxygen or is an oxidizer. The precursors enter the chamber as gases or vapors and react so as to bring about an atomic concentration of a carbon containing species, for example carbonyl, in a fabricated correlated electron material of between 0.1% and 10.0% making a film of correlated electron material that exhibits a first impedance state and a second impedance state substantially dissimilar from one another. The oxidizer, such as $O_2$, NO, $N_2O$, water, $O^*$, $O_3$ or other is adjusted as a function of time to cause the ligand dopant, such as the carbon containing species, for example CO, or the nitrogen containing species such as CN that will result in the correlated electron film containing an atomic concentration of the carbon species of between 0.1% and 10.0%, and the film of correlated electron material exhibiting a first impedance state and a second impedance state substantially dissimilar from one another. The relative amounts of the oxidizer may change as a function of time in order to form a layer of relatively high doped CEM, followed by a relatively low doped CEM, followed by a relatively high doped CEM.

FIG. 2B

Physical Vapor Deposition or PVD or Sputter 270

Expose a substrate (heated or at room temperature) in a chamber to reactant(s) by producing a vapor of the source material through heating a source containing the material or sputtering the material from a target made of the material, for example NiO. The vaporized material is then deposited on the substrate. An example is to sputter a nickel oxide target under vacuum with a substrate in "line of sight". Nickel oxide deposits on the substrate. The CEM film is sputtered with a target containing a dopant species, for example a carbon species such as carbonyl, that will result in the correlated electron film containing an atomic concentration of the carbon species of between 0.1% and 10.0%, and the film of correlated electron material exhibiting a first impedance state and a second impedance state substantially dissimilar from one another. In this embodiment, the sputtering ambient contains an oxidizer whose species and/or flow rate is adjusted to allow control of the amount of incorporated carbon as a function of the thickness of the deposited film. Alternatively, the target may be Ni and an additional target of carbon may be co-sputtered in an ambient of an oxidizer whose species or flowrate changes as a function of time to control the amount of incorporated carbon.

FIG. 2C

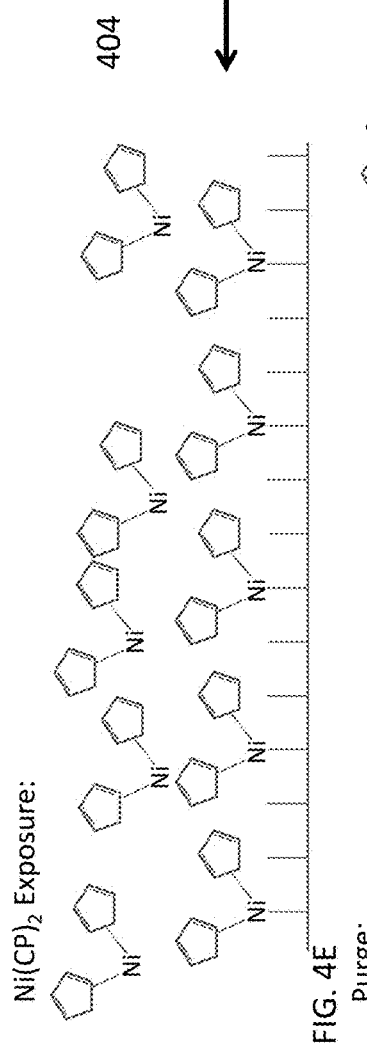
Ni(CP)₂ Exposure:
FIG. 4E
Purge:
FIG. 4F
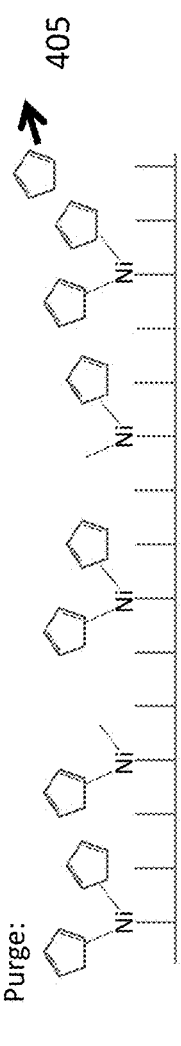
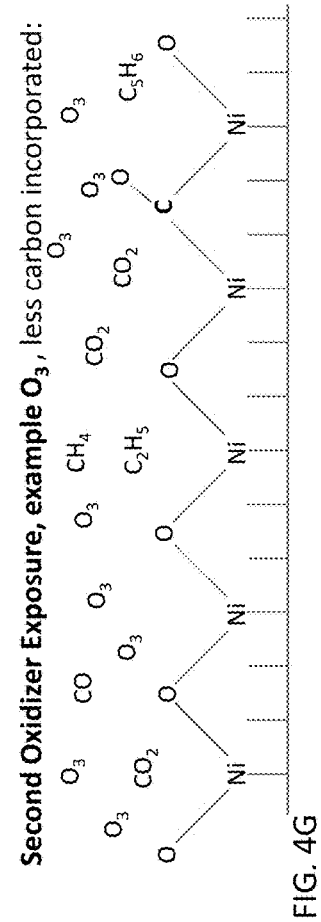
Second Oxidizer Exposure, example O₃, less carbon incorporated:
FIG. 4G
Purge:
FIG. 4H
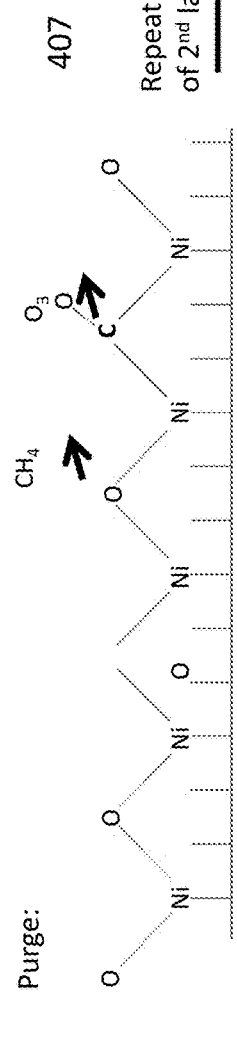
Repeat cycles to thickness of 2nd layer, p layer Ni(CP)₂ Exposure:

408

Purge:

409

First Oxidizer Exposure, example O₂:

410

Purge:

411

Repeat cycles to thickness of 3rd layer, p+ layer

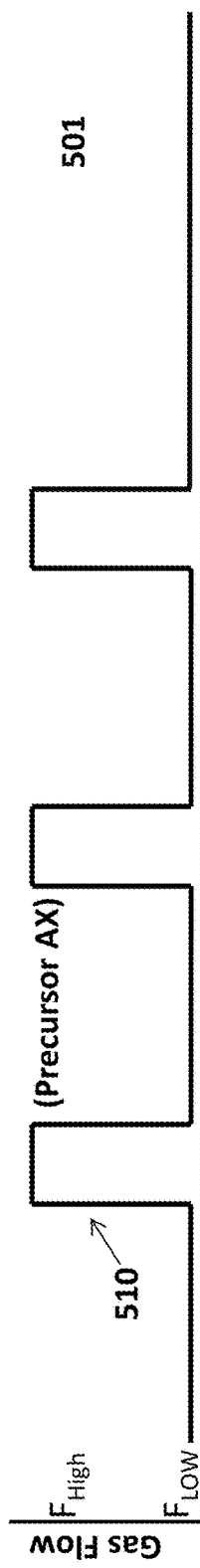
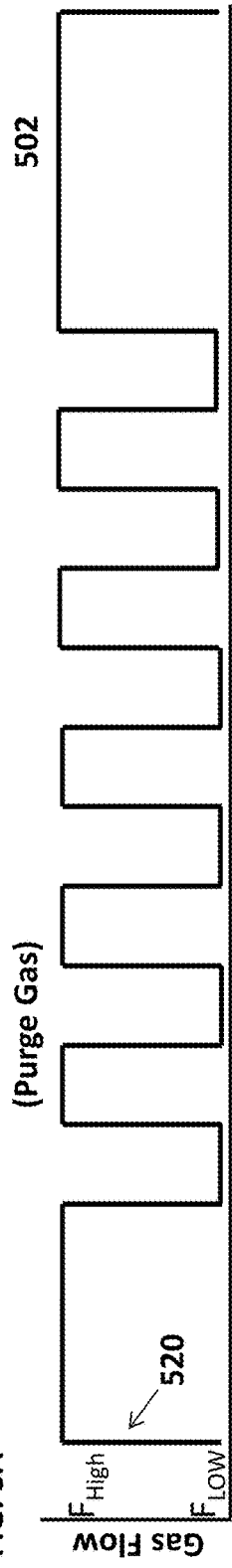
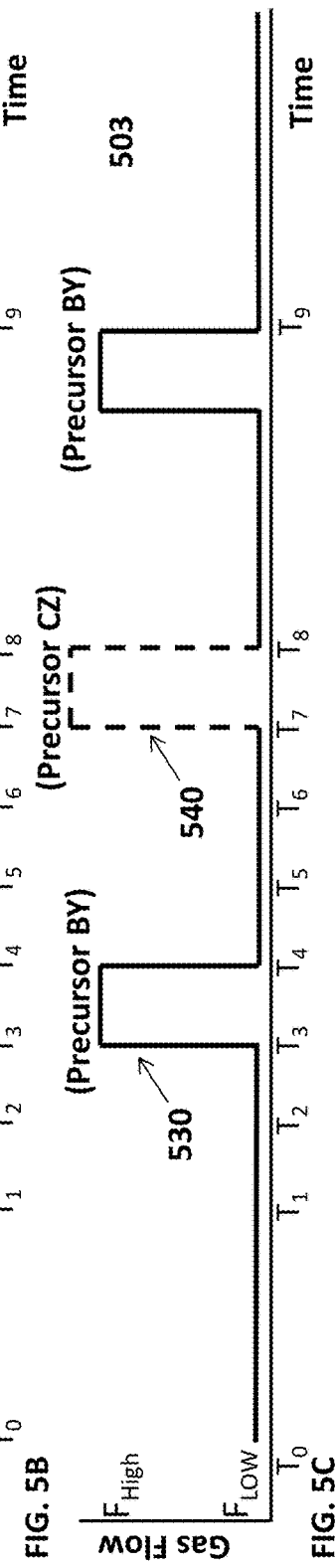
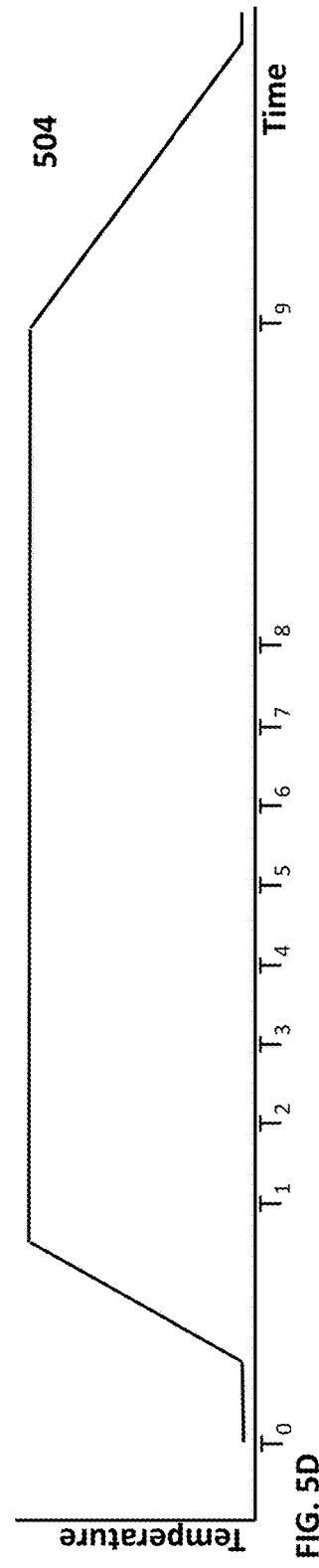
FIG. 5A
FIG. 5B
FIG. 5C
FIG. 5D

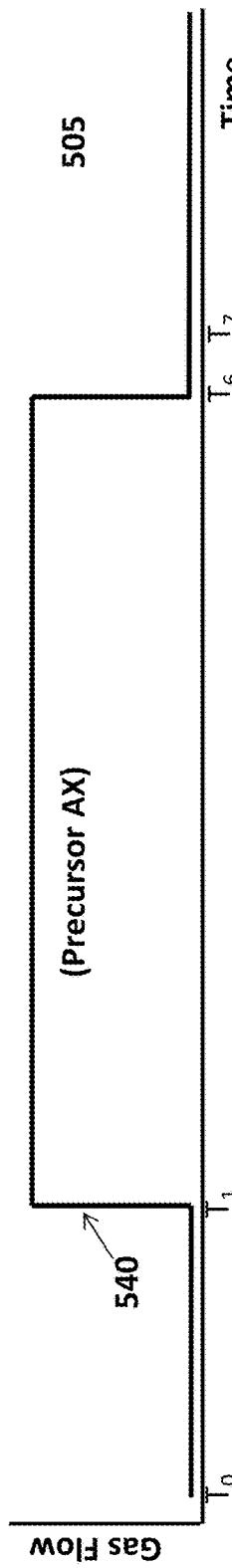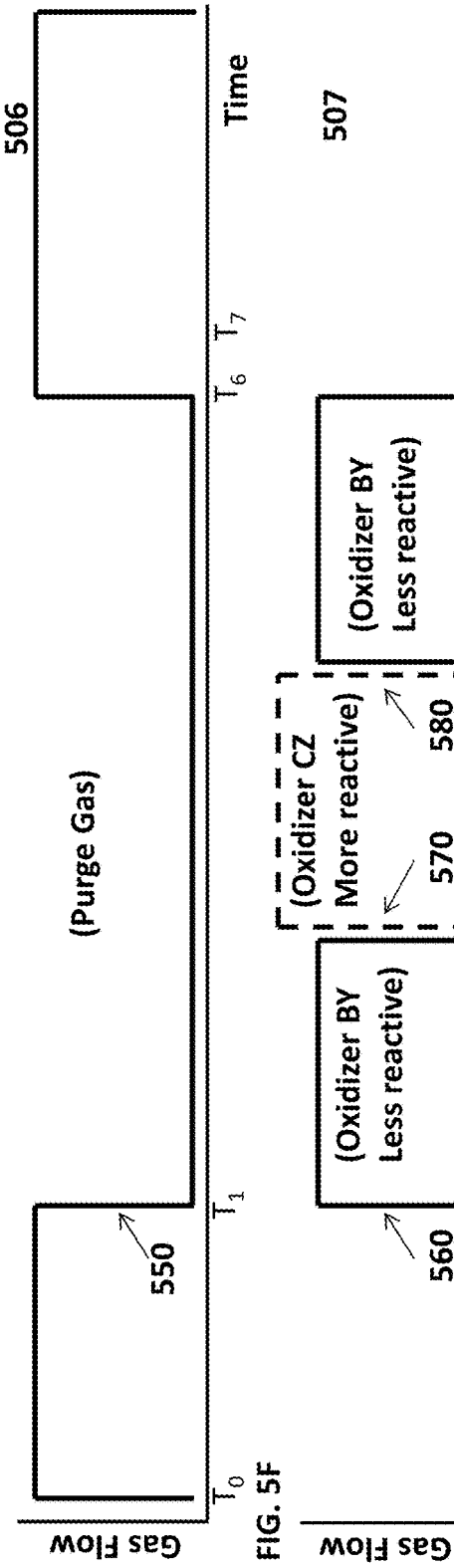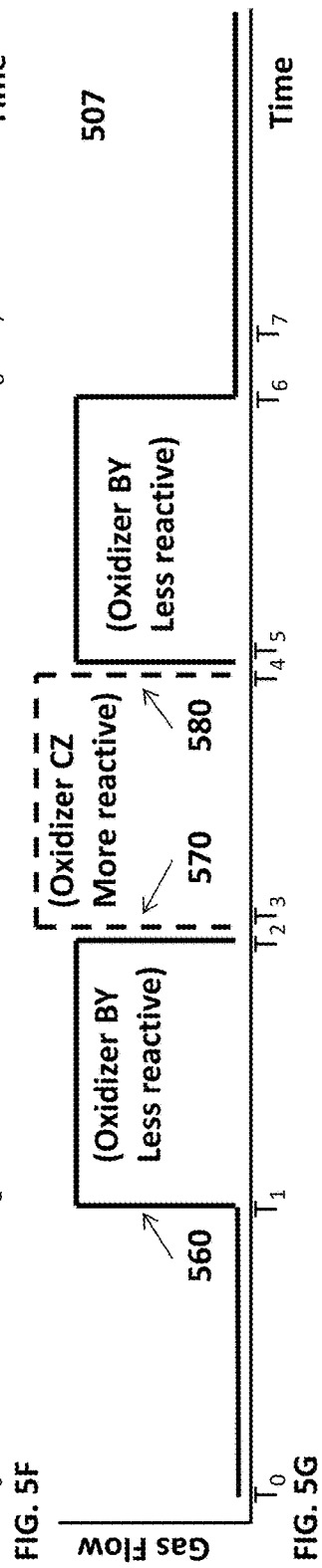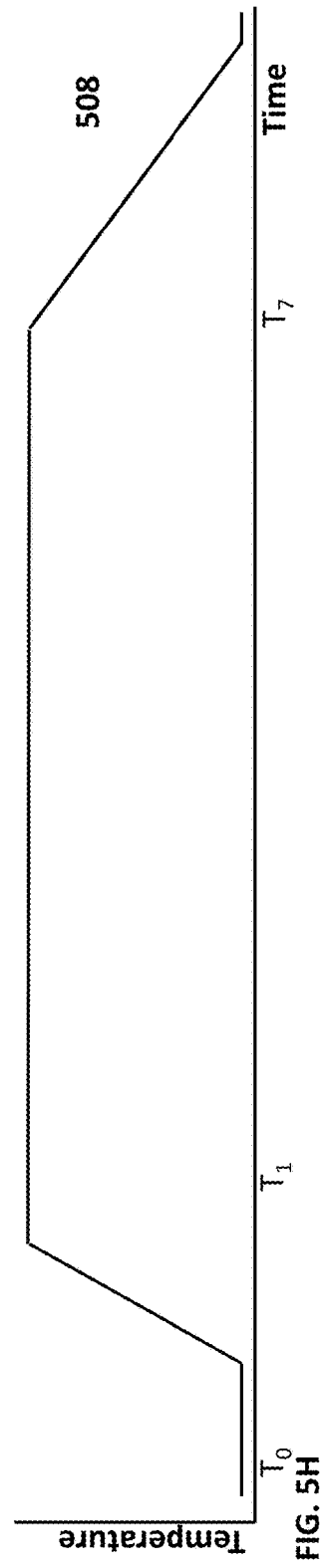

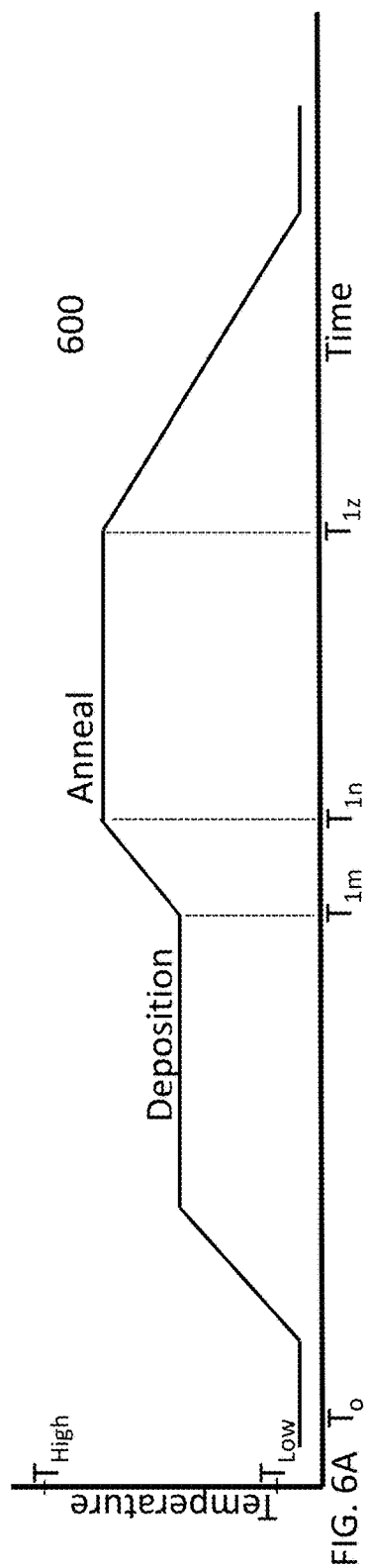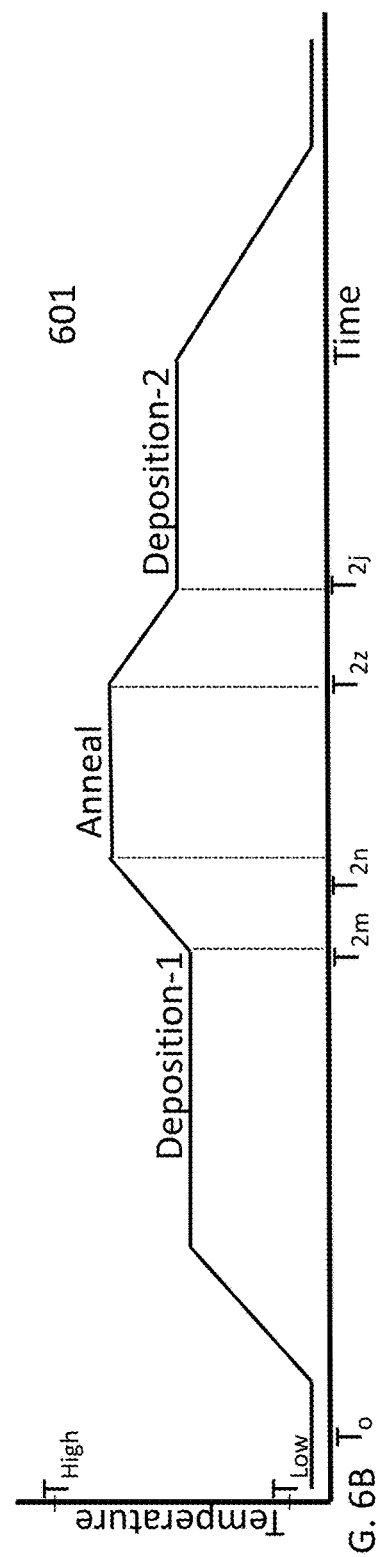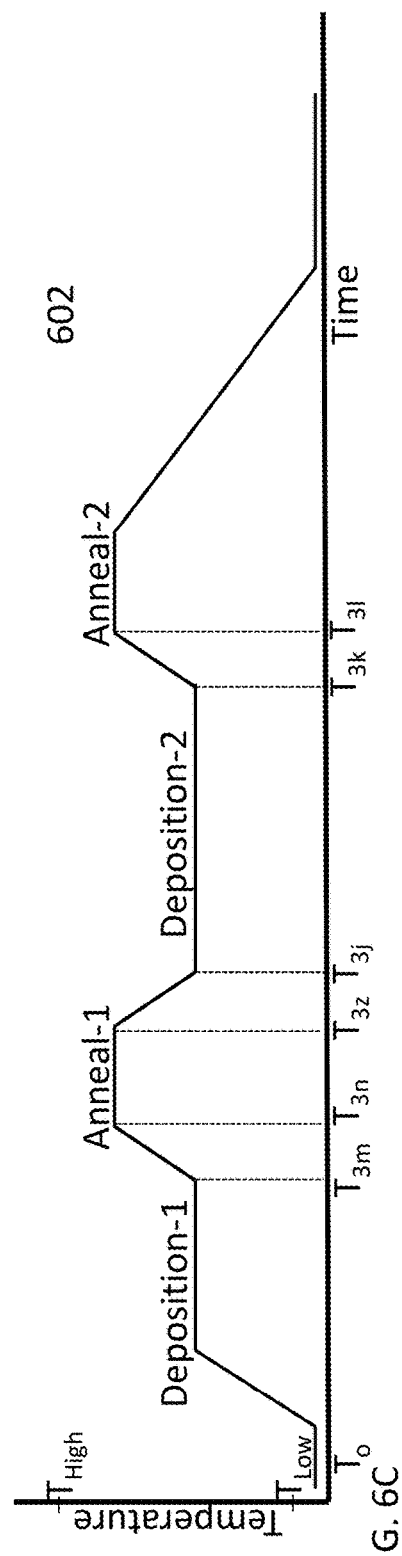

ental applications. This application is also a divisional of U.S. patent application Ser. No. 15/048,244, titled "FABRICATION OF CORRELATED ELECTRON MATERIAL DEVICES METHOD TO CONTROL CARBON," and filed on Feb. 16, 2016, which is assigned to the assignee of claimed subject matter and incorporated herein by reference in its entirety.

FABRICATION OF CORRELATED ELECTRON MATERIAL DEVICES METHOD TO CONTROL CARBON

CROSS REFERENCE TO RELATED APPLICATIONS

This application is related to U.S. patent application Ser. No. 15/048,778, titled "METHOD PROVIDING FOR A STORAGE ELEMENT," filed on Feb. 19, 2016, and incorporated herein by reference in its entirety. This application is also a divisional of U.S. patent application Ser. No. 15/048,244, titled "FABRICATION OF CORRELATED ELECTRON MATERIAL DEVICES METHOD TO CONTROL CARBON," and filed on Feb. 16, 2016, which is assigned to the assignee of claimed subject matter and incorporated herein by reference in its entirety.

BACKGROUND

Field

Subject matter disclosed herein relates to correlated electron devices, and may relate, more particularly, to approaches toward fabricating correlated electron devices, such as may be used in switches, memory circuits, and so forth, exhibiting desirable impedance characteristics.

Integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, and so forth. Factors related to electronic switching devices, such as may be incorporated in memory and/or logic devices, which may be of interest to a designer in considering suitability for any particular application may include physical size, storage density, operating voltages, impedance ranges, and/or power consumption, for example. Other example factors that may be of interest to designers may include cost of manufacture, ease of manufacture, scalability, and/or reliability. Moreover, there appears to be an ever-increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings, in which:

FIG. 2A-2C show simplified flowcharts of methods for fabricating correlated electron material films that comprise carbon or other dopant species concentrations controlled according to one or more embodiments;

FIGS. 4A-4L show sub-processes utilized in a method for fabricating correlated electron material devices according to an embodiment;

FIGS. 5A-5D are diagrams showing gas flow and temperature profiles, as a function of time, which may be used in a method for fabricating correlated electron material devices according to an embodiment;

FIGS. 5E-5H are diagrams showing precursor flow and temperature profiles, as a function of time, which may be used in a method for fabricating correlated electron device materials according to an embodiment; and FIGS. 6A-6C are diagrams showing temperature profiles, as a function of time, used in deposition and annealing processes for fabricating correlated electron material devices according to an embodiment.

Figure 1A:
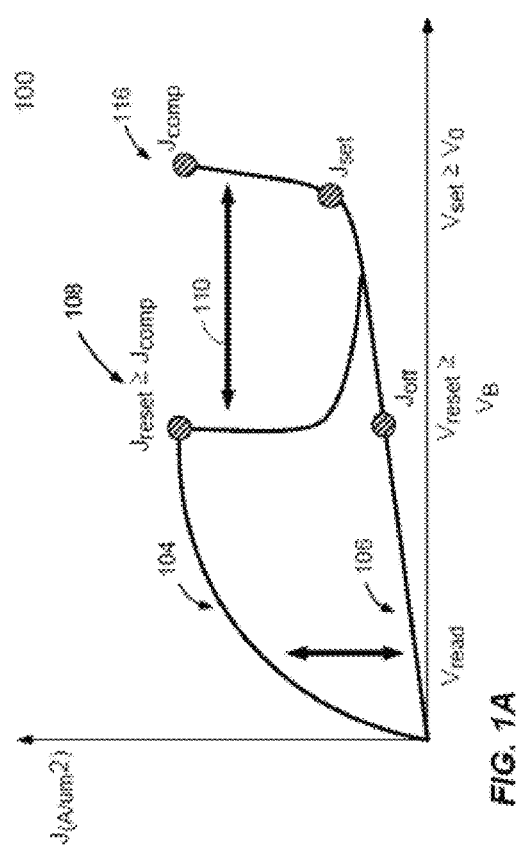
FIG. 1A is a diagram showing an example current density versus voltage profile of a device formed from a correlated electron material according to an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Additionally, it is to be understood that other embodiments may be utilized. Further, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to "one implementation," "an implementation," "one embodiment," "an embodiment," and/or the like, means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled," "connected," and/or similar terms are used generically. It should be understood that these terms are not intended as synonyms. Rather, "connected" is used generically to indicate that two or more components, for example, are in direct physical, including electrical, contact; while "coupled" is used generically to mean that two or more components are potentially in direct physical, including electrical, contact; however, "coupled" is also used generically to also mean that two or more components are not necessarily in direct contact, but nonetheless are able to cooperate and/or interact. The term coupled is also understood generically to mean indirectly connected, for example, in an appropriate context.

The terms, "and," "or," "and/or" and/or similar terms, as used herein, include a variety of meanings that also are expected to depend, at least in part, upon the particular context in which such terms are used. Typically, "or" if used to associate a list, such as A, B, or C, is intended to mean A, B, and C, here used in the inclusive sense, as well as A, B, or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

Particular aspects of the present disclosure describe methods and/or processes for preparing and/or fabricating correlated electron materials (CEMs) to form a correlated electron switch, for example, such as may be utilized to form a correlated electron random access memory (CERAM) in memory and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects. In this context, a CEM switch may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3}a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM device may comprise one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to an anion, such as oxygen or other types of ligands), or combinations thereof, although claimed subject matter is not limited in scope in this respect.

FIG. 1A is a diagram showing an example current density versus voltage profile of a device formed from a CEM according to an embodiment 100. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may place the CEM device into a relatively low-impedance memory state. Conversely, application of a voltage $V_{reset}$ and a current density $J_{reset}$ may place the CEM device into a relatively high-impedance memory state. As shown in FIG. 1A, reference designator 110 illustrates the voltage range that may separate $V_{set}$ from $V_{reset}$. Following placement of the CEM device into an high-impedance state or low-impedance state, the particular state of the CEM device may be detected by application of a voltage $V_{read}$ (e.g., during a read operation) and detection of a current or current density at terminals of the CEM device.

According to an embodiment, the CEM device of FIG. 1A may include any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, the CEM device of FIG. 1A may comprise materials of the general form AB:$L_x$ (such as NiO:CO) that are transition metal, transition metal compounds, or transition metal oxide variable impedance materials; though it should be understood that these are exemplary only and are not intended to limit claimed subject matter. Particular implementations may employ other variable impedance materials as well. Nickel oxide, NiO, is disclosed as one particular TMO. NiO materials discussed herein may be doped with extrinsic ligands, $L_x$ which may establish and/or stabilize variable impedance properties. In particular, NiO variable impedance materials disclosed herein may include a carbon-containing ligand such as carbonyl (CO), forming NiO:CO. In another particular example, NiO doped with extrinsic ligands may be expressed as NiO:$L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. In particular, NiO variable impedance materials disclosed herein may include carbon containing molecules of the form CaHbNdOf (in which a≥1, and b, d and f≥0) such as: carbonyl (CO), cyano (CN⁻), ethylene diamine ($C_2H_8N_2$), phen(1,10-phenanthroline) ($C_{12}H_8N_2$), bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate (NCS⁻), for example.

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a substantially dissimilar impedance state, such as a relatively high-impedance state, responsive to a Mott transition. This may correspond to point 108 of the voltage versus current density profile of FIG. 1A. At, or suitably nearby this point, electrons are no longer screened and become localized near the metal ion. This correlation may result in a strong electron-electron interaction potential which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. If a threshold current of electrons is injected and a threshold potential is applied across terminals to place the CEM device into a "set" state, an increase in electrons may screen incoming electrons and remove a localization of electrons, which may operate to collapse the band-splitting potential, thereby bringing about a relatively low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally-applied compliance current may, in some embodiments, also set a condition of a current density for a subsequent reset operation to place the CEM device into a relatively high-impedance state. As shown in the particular implementation of FIG. 1A, a current density $J_{comp}$ may be applied during a write operation at point 116 to place the CEM device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$
$$n = \left(\frac{C}{\lambda_{TF}}\right)^3$$

In expression 1, $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device.

This may be modeled according to expression (2) as follows:

$$I_{MI}(V_{MI}) = \frac{dQ(V_{MI})}{dt} \approx \frac{Q(V_{MI})}{t} \qquad (2)$$
$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$
$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

In which $A_{CEM}$ is a cross-sectional area of a CEM device; and $J_{reset}(V_{MI})$ may represent a current density through the CEM device to be applied to the CEM device at a threshold voltage which may place the CEM device in a relatively high-impedance state.

Figure 1B:
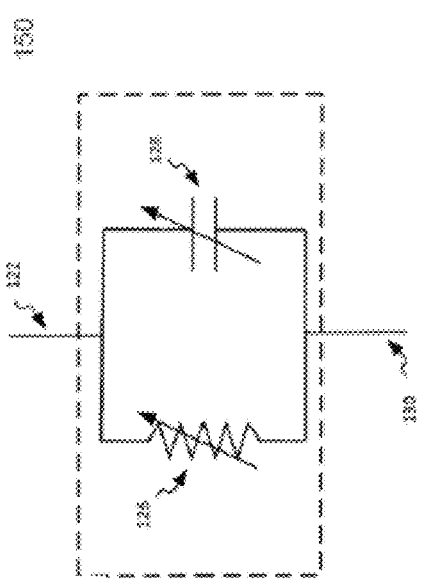
FIG. 1B is a schematic diagram of an equivalent circuit of a correlated electron material switch according to an embodiment.

FIG. 1B depicts a schematic diagram of an equivalent circuit of an example CEM switch device according to an embodiment 150. As previously mentioned, a correlated electron device, such as a CEM switch, a CERAM array, or other type of device utilizing one or more correlated electron materials may comprise variable or complex impedance device that may exhibit characteristics of both variable resistance and variable capacitance. In other words, impedance characteristics for a CEM variable impedance device, such as the device according to embodiment 150, may depend at least in part on resistance and capacitance characteristics of the device if measured across device terminals 122 and 130, for example. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1A as comprising discrete components, a variable impedance device, such as device of embodiment 150, may comprise a substantially homogenous CEM and claimed subject matter is not limited in this respect.

Table 1 below depicts an example truth table for an example variable impedance device, such as the device of embodiment 150.

TABLE 1

Correlated Electron Switch Truth Table

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In an embodiment, Table 1 shows that a resistance of a variable impedance device, such as the device of embodiment 150, may transition between a low-impedance state and a substantially dissimilar high-impedance state as a function at least partially dependent on a voltage applied across the CEM device. In an embodiment, an impedance exhibited at a low-impedance state may be approximately in the range of 10.0-100,000.0 times lower than a substantially dissimilar impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Truth Table 1 shows that a capacitance of a variable impedance device, such as the device of embodiment 150, may transition between a lower capacitance state, which, in an example embodiment, may comprise approximately zero, or very little, capacitance, and a higher capacitance state that is a function, at least in part, of a voltage applied across the CEM device.

According to an embodiment, a CEM device, which may be utilized to form a CEM switch, a CERAM memory device, or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as from a low-impedance state to a substantially dissimilar high-impedance state, for example, may be brought about by the "back-donation" of electrons of compounds comprising $Ni_xO_y$ (wherein the subscripts "x"

and "y" comprise whole numbers). As the term is used herein, "back-donation" refers to a supplying of one or more electrons to a transition metal, transition metal oxide, transition metal compound or any combination thereof, by an adjacent molecule of the lattice structure, for example, comprising the transition metal, transition metal compound, transition metal oxide, or combination thereof. Back-donation permits a transition metal, transition metal compound, transition metal oxide, or combination thereof, to maintain an ionization state that is favorable to electrical conduction under the influence of an applied voltage. In certain embodiments, back-donation in a correlated electron material, for example, may occur responsive to use of a carbon containing dopant, such as carbonyl (CO), for example, which permits a correlated electron material to exhibit a property in which electrons are controllably, and reversibly, "donated" to a conduction band of the transition metal or transition metal oxide, such as nickel, for example, during operation of a device or circuit comprising a correlated electron material. Back donation may be reversed, for example, in nickel oxide material (e.g., NiO:CO), thereby permitting the nickel oxide material to switch to exhibiting a substantially dissimilar impedance property, such as a high-impedance property, during device operation. Thus, in this context, a back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+ (e.g., $Ni^{2+}$ in a material, such as NiO:CO). Conversely, electron back-donation may be reversed if the transition metal, such as nickel, for example, is placed into an oxidation state of either 1+ or 3+. Accordingly, during operation of a correlated electron material device, back-donation may result in "disproportionation," which may comprise substantially simultaneous oxidation and reduction reaction, substantially in accordance with expression 4, below:

$$2Ni^{2+} \rightarrow Ni^{1+} + Ni^{3+} \qquad (4)$$

Such disproportionation, in this instance refers to formation of nickel ions as $Ni^{1+} + Ni^{3+}$ as shown in expression (4), which may bring about, for example, a relatively high-impedance state during operation of the CEM device. In an embodiment, a carbon-containing ligand, such as a carbonyl molecule (CO), may permit sharing of electrons during operation of the CEM device so as to permit the disproportionation reaction of expression 4, and its reversal, substantially in accordance with expression 5, below:

$$Ni^{1+} + Ni^{3+} \rightarrow 2Ni^{2+} \qquad (5)$$

As previously mentioned, reversal of the disproportionation reaction, as shown in expression (5), permits nickel-based CEM to return to a relatively low-impedance state In embodiments, depending on a molecular concentration of NiO:CO, for example, which may vary from values approximately in the range of an atomic percentage of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of a back-donating material, such as NiO:CO and other materials present in the CEM device, as well as other process variations, and claimed subject matter is not limited in this respect.

In certain embodiments, atomic layer deposition may be utilized to form or to fabricate films comprising nickel oxide materials, such as NiO:CO, to permit electron back-donation during operation of the CEM device in a circuit environment, for example, to give rise to a low-impedance state. Also during operation in a circuit environment, for example, electron back-donation may be reversed so as to give rise to a substantially dissimilar impedance state, such as a high-impedance state, for example. In particular embodiments, atomic layer deposition may utilize two or more precursors to deposit components of, for example, NiO:CO, or other transition metal oxide, transition metal, or combination thereof, onto a conductive substrate. In an embodiment, layers of a CEM device may be deposited utilizing separate precursor molecules, AX and BY, according to expression (6a), below:

$$AX_{(gas)} + BY_{(gas)} = AB_{(solid)} + XY_{(gas)} \qquad (6a)$$

Wherein "A" of expression (6a) corresponds to a transition metal, transition metal compound, transition metal oxide, or any combination thereof. In embodiments, a transition metal oxide may comprise nickel, but may comprise other transition metals, transition metal compound, and/or transition metal oxides, such as aluminum, cadmium, chromium, cobalt, copper, gold, iron, manganese, mercury, molybdenum, nickel palladium, rhenium, ruthenium, silver, tin, titanium, vanadium. In particular embodiments, compounds that comprise more than one transition metal oxide may also be utilized, such as yttrium titanate ($YTiO_3$).

In embodiments, "X" of expression (6a) may comprise a ligand, such as organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-aminopent-2-en-4-onato $(apo)_2$, $(dmamb)_2$ where dmamb=1-dimethylamino-2-methyl-2-butanolate, (dmamp)2 where dmamp=1-dimethylamino-2-methyl-2-propanolate, Bis (pentamethylcyclopentadienyl) $(C_5(CH_3)_5)_2$ and carbonyl $(CO)_4$. Accordingly, in some embodiments, nickel-based precursor AX may comprise, for example, nickel amidinate (Ni(AMD)), nickel dicyclopentadienyl $(Ni(Cp)_2)$, nickel diethylcyclopentadienyl $(Ni(EtCp)_2)$, Bis(2,2,6,6-tetramethylheptane-3,5-dionato)Ni(II) $(Ni(thd)_2)$, nickel acetylacetonate $(Ni(acac)_2)$, bis(methylcyclopentadienyl)nickel (Ni $(CH_3C_5H_4)_2$, Nickel dimethylglyoximate $(Ni(dmg)_2)$, Nickel 2-amino-pent-2-en-4-onato $(Ni(apo)_2)$, $Ni(dmamb)_2$ where dmamb=1-dimethylamino-2-methyl-2-butanolate, $Ni(dmamp)_2$ where dmamp=1-dimethylamino-2-methyl-2-propanolate, Bis(pentamethylcyclopentadienyl) nickel (Ni $(C_5(CH_3)_5)_2$, and nickel carbonyl $(Ni(CO)_4)$, just to name a few examples; organometallic compounds of other transition or lanthanide metals will be apparent from this list. In expression (6a), precursor "BY" may comprise an oxidizer, such as oxygen ($O_2$), ozone ($O_3$), nitric oxide (NO), nitrous oxide ($N_2O$), hydrogen peroxide ($H_2O_2$), just to name a few examples. In other embodiments, plasma may be used with an oxidizer to form oxygen radicals.

However, in particular embodiments, a dopant precursor in addition to precursors AX and BY may be utilized to form layers of the CEM device. An additional dopant precursor, which may co-flow with precursor AX, may permit formation of back-donating compounds, substantially in accordance with expression (6b), below. In embodiments, one or more dopant precursors such as methane ($CH_4$), ethane ($C_2H_6$), propane ($C_3H_8$), butane ($C_4H_{10}$), acetylene ($C_2H_2$), carbon monoxide (CO), and/or carbon dioxide ($CO_2$) as well as mixtures thereof, may be utilized, as may other precursors comprising. Thus, expression (6a) may be modified to include an additional dopant ligand substantially in accordance with expression (6b), below:

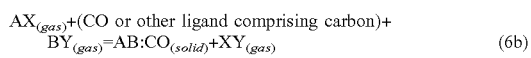
(6b)

It should be noted that concentrations, such as atomic concentration, of precursors, such as AX, BY, and CO (or other ligand comprising carbon) of expressions (6a) and (6b) may be adjusted so as to bring about a final atomic concentration of carbon in a fabricated CEM device, such as in the form of carbonyl (CO), of between approximately 0.1% and 10.0%. However, claimed subject matter is not necessarily limited to the above-identified precursors and/or atomic concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition or the like, utilized in fabrication of CEM devices. In expressions (6a) and (6b), "BY" may comprise an oxidizer, such as oxygen ($O_2$), ozone ($O_3$), nitric oxide (NO), hydrogen peroxide ($H_2O_2$), just to name a few examples. In other embodiments, plasma may be used with an oxidizer (BY) to form oxygen radicals. Likewise, plasma may be used with the carbon doping species to form an activated carbon species.

In particular embodiments, such as embodiments utilizing atomic layer deposition, a substrate may be exposed to precursors in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:CO is performed, temperature ranges approximately in the range of 20.0° C. and 400.0° C. may be utilized. After exposure to precursor sources, such sources may be purged from the heated chamber, wherein purging may occur over durations approximately in the range of 0.5 seconds to 180.0 seconds. It should be noted, however, that these are merely examples of potentially suitable temperatures and exposure times, and claimed subject matter is not limited in this respect.

In certain embodiments, a single two-precursor cycle (e.g., AX and BY, as described with reference to expression 6(a)) or a single three-precursor cycle (e.g., AX, $NH_3$ or other ligand comprising nitrogen, and BY, as described with reference to expression 6(b)) utilizing atomic layer deposition may bring about a CEM device layer comprising a thickness approximately in the range of 0.6 Å to 1.5 Å Accordingly, in an embodiment, to form a CEM device film comprising a thickness of approximately 500 Å utilizing an atomic layer deposition process, 800-900 two-precursor (expression 6(a)) or three-precursor (expression 6(b)) cycles may be utilized. It should be noted that atomic layer deposition may be utilized to form CEM device films having other thicknesses, such as thicknesses approximately in the range of 200 Å and 1000 Å, for example, and claimed subject matter is not limited in this respect.

In particular embodiments, responsive to one or more two-precursor cycles (e.g., AX and BY), or three-precursor cycles (AX, CO or other ligand comprising carbon, and BY), of atomic layer deposition, a CEM device film may undergo in situ annealing, which may permit improvement of film properties or may be used to incorporate the carbon-containing dopant, such as in the form of carbonyl, in the CEM device film. In certain embodiments, a chamber may be heated to a temperature approximately in the range of 20° C. to 1000° C. However, in other embodiments, in situ annealing may be performed utilizing temperatures approximately in the range of 150° C. to 800° C. In situ annealing times may vary from duration approximately in the range of 1 second to 5 hours. In particular embodiments, annealing times may vary within more narrow ranges, such as, for example, from approximately 0.5 minutes to approximately 180 minutes, for example, and claimed subject matter is not limited in these respects.

Figure 1C:
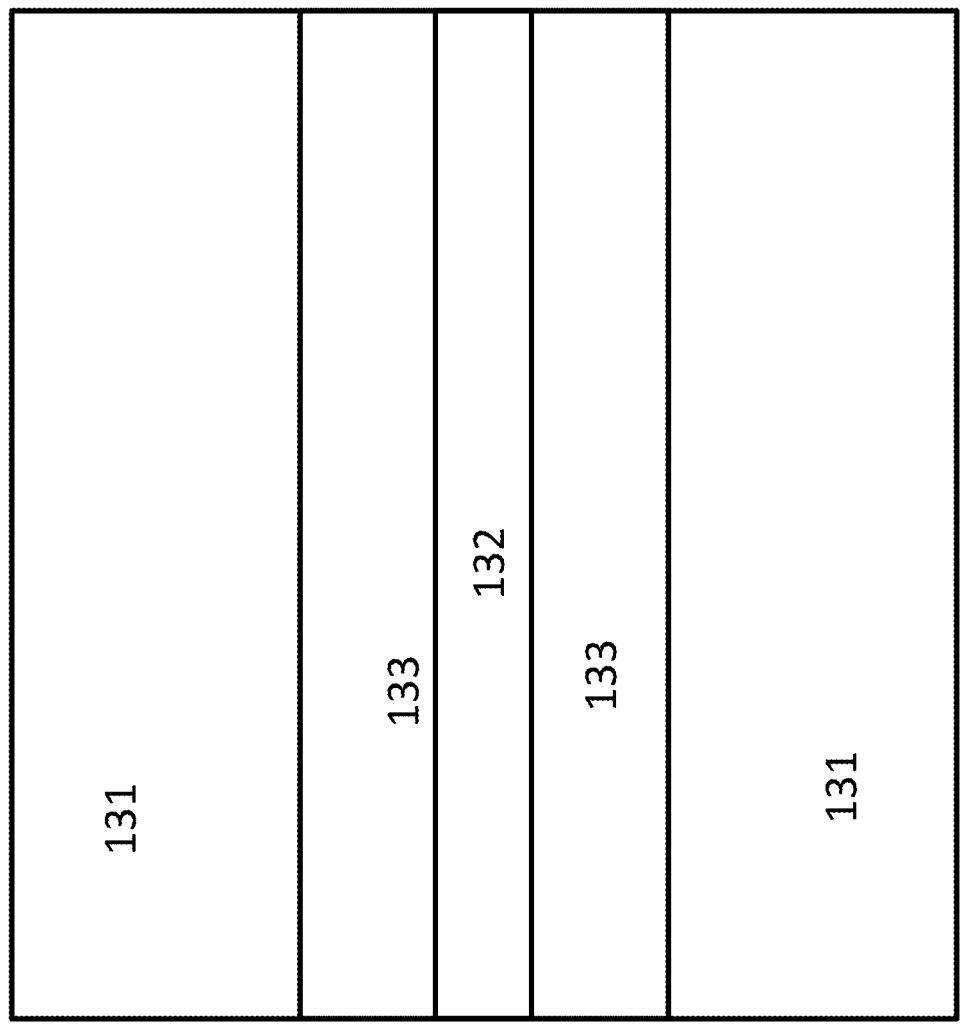
FIG. 1C is a diagram showing a layered structure where the CEM films are bounded by electrodes and the CEM films vary in dopant, for example the center film may be less doped than the outer CEM films.

FIG. 1C shows one implementation of a storage element comprising a correlated electron switch. The CES element 130, which may function as a correlated electron random access memory (CeRAM), comprises an arrangement in which a switching region 132 is provided between two relatively conductive regions 133. The conductive regions, 132, may comprise or be provided with respective terminal electrodes, regions 131, for the storage element.

The conductive regions, 133, may comprise a correlated electron material that is doped to a different level, such as a relatively higher level compared to region 132, such that they are relatively more conducting at the operating voltages applied to the element than region 132. Suitable materials for the conductive regions include transition metals, transition metal oxides, and transition metal compounds doped with ligands such as carbonyl (CO), for example NiO:CO.

The switching region 132 comprises a correlated electron material which is capable of switching from a conductor state to an insulator state (and vice-a-versa) at an operating voltage applied to the element. Suitable correlated electron materials for the switching region include doped and undoped transition metals, transition metal compounds, and transition metals oxides, for example NiO:CO which are capable of acting as a Mott insulator, a charge exchange insulator or an Anderson disorder insulator under the operating conditions of the element.

In FIG. 1C, the storage element may comprise one that has been tuned by selection of relative amounts of dopant across the thin film layers to an optimum performance, for example, as a memory storage element.

For example, in the case that the dopant is a p-type dopant (for example, carbonyl) providing that the thin film is hole conducting, the first, second and third amounts of dopant may provide a doping profile for the conductive regions and the switching region which may be described as p+/p/p+ or p/p+/p where p indicates that the doping provides for hole conducting in a conductive or switching region and + indicates the relative amount of doping in those regions.

FIG. 2A shows a simplified flowchart for a method for fabricating correlated electron device materials according to an embodiment 201. Example implementations, such as described in FIGS. 2A, 2B, and 2C, for example, may include blocks in addition to those shown and described, fewer blocks, or blocks occurring in an order different than may be identified, or any combination thereof. In an embodiment, a method may include blocks 210, 220, 230, 240 and 250, for example. The method of FIG. 2A may accord with the general description of atomic layer deposition previously described herein. The method of FIG. 2A may begin at block 210, which may comprise exposing the substrate, in a heated chamber, for example, to a first precursor in a gaseous state (e.g., "AX"), wherein the first precursor comprises a transition metal oxide, a transition metal, a transition metal compound or any combination thereof, and a first ligand (the ligand need not comprise a carbon dopant source). Examples of carbon-containing ligands for nickel precursors include nickel cyclopentadienyl $Ni(Cp)_2$, nickel bis(methylcyclopentadienyl), and Nickel dimethylglyoximate; to name a few. The method may continue at block 220, which may comprise removing the excess precursor AX and byproducts of AX by using an inert gas or evacuation or both. The method may continue at block 230, which may comprise exposing the substrate to a second precursor (e.g., BY) in a gaseous state, wherein the second precursor comprises a oxidizer such as oxygen ($O_2$), ozone ($O_3$), nitric oxide (NO), hydrogen peroxide ($H_2O_2$), nitric oxide (NO), nitrous oxide ($N_2O$), nitrogen dioxide ($NO_2$), or a source from the nitrogen oxide family ($N_xO_y$), or precursors with an $NO_3$ ligand; just to name some examples; so as to form a first layer of the film of a CEM device. In other embodiments, plasma may be used with an oxidizer (BY) to form oxygen radicals. The method may control the amounts of reactant precursors by controlling the mass flow, for example, the oxidizing reactant precursor to the substrate during the exposure time. The mass flow can be controlled by a mass flow controller (MFC) in a precise and highly repeatable way not least because the reaction boundary layer over the substrate can be controlled by other parameters such as pressure and the direction and speed of gas flow relative to the substrate in a precise and highly repeatable way. The method may continue at block 240, which may comprise removing the excess precursor BY and byproducts of BY through the use of an inert gas or by way of evacuation or by way of a combination of evacuation of the process chamber and purging of the chamber using an inert gas. The method may continue at block 250, which may comprise repeating the exposing of the substrate to the first and second precursors with intermediate purge and/or evacuation steps so as to form additional layers of the film until the correlated electron material is capable of exhibiting a ratio of first to second impedance states of at least 5.0:1.0.

This general description shown in 200 describes atomic layer deposition. The amount of ligand dopant, such as CO in NiO:CO that is incorporated will be a key feature of the structure shown in FIG. 1C. The method describes controlling the incorporation of the carbonyl in layers 133 of embodiment 130 of FIG. 1C, relative to the switching layer 132, by adjusting the oxidizer flow rate or the oxidizer species to control the carbon concentration.

FIG. 2B shows a simplified flowchart for a method for fabricating correlated electron device materials according to an embodiment 202. The method of FIG. 2B may accord with the general description of chemical vapor deposition or CVD or variations of CVD such as plasma enhanced CVD, hot wire CVD, rapid thermal CVD and others. In FIG. 2B, such as at block 260, a substrate may be exposed to precursor AX and BY simultaneously under conditions of pressure and temperature to promote the formation of AB, which corresponds to a CEM. In the exemplary case of NiO:CO, the precursor AX may be represented by Ni(Cp)2 or another nickel containing precursor; and BY may be O2 or O3 or another oxidizer; the method here describes changing either the flow rate and or the oxidizer species as a function of time to form the structure such as shown in FIG. 1C where the relative amounts of dopant in regions 133 are different, such as higher, than the amount of dopants in 132 of embodiment 130. The method may control the relative amounts of reactant precursors by controlling the mass flow of at least one reactant precursor, for example, the oxidizing reactant precursor to the substrate. The mass flow can be controlled by a mass flow controller (MFC) in a precise and highly repeatable way not least because the reaction boundary layer over the substrate can be controlled by other parameters such as pressure and the direction and speed of gas flow relative to the substrate in a precise and highly repeatable way. Additional approaches may be employed to bring about formation of a CEM, such as application of direct or remote plasma, use of hot wire to partially decompose precursors, or lasers to enhance reactions as examples of forms of CVD. The CVD film processes and/or variations may occur for a duration and under conditions as can be determined by one skilled in the art of CVD until, for example, correlated electron material having appropriate thickness and exhibiting appropriate properties, such as electrical properties, such as a ratio of first to second impedance states of at least 5.0:1.0.

FIG. 2C shows a simplified flowchart for a method for fabricating correlated electron device materials according to an embodiment 270. The method of FIG. 2C may accord with the general description of physical vapor deposition or PVD or Sputter Vapor Deposition or variations of these and/or related methods. In FIG. 2C a substrate may be exposed in a chamber, for example, to an impinging stream of precursor having a "line of sight" under particular conditions of temperature and pressure to promote formation of a CEM comprising material $AB:L_x$. The source target(s) may be, for example, AB or A and B and or $L_x$ from separate "targets" wherein deposition is brought about using a stream of atoms or molecules that are physically or thermally or by other means removed (sputtered) from a target(s) in "line of sight" of the substrate in a process chamber whose pressure is low enough or lower such that the mean free path of the atoms or molecules of A or B or AB is approximately or more than the distance from the target to the substrate. The stream of AB (or A or B and/or $L_x$) may combine to form $AB:L_x$ on the substrate due to conditions of the reaction chamber pressure, temperature of the substrate and other properties that are controlled by one skilled in the art of PVD and sputter deposition. In other embodiments of PVD or sputter deposition, the ambient environment may be a source such as an oxidizer, for example O2, O3, NO, N2O, H2O2 or plasma activated O*, for example. The flow rate and/or changing the oxidizer species results in the control of the amount of carbon incorporated in the film, for example changing the oxidizer species as a function of time to form the structure such as shown in FIG. 1C where the relative amounts of dopant in regions 133 are different, such as higher, than the amount of dopants in 132 of embodiment 130. The PVD film deposition and its variations will continue for a time required and under conditions as can be determined by one skilled in the art of PVD until correlated electron material of thickness and properties is deposited that is capable of exhibiting a ratio of first to second impedance states of at least 5.0:1.0.

Figure 3:
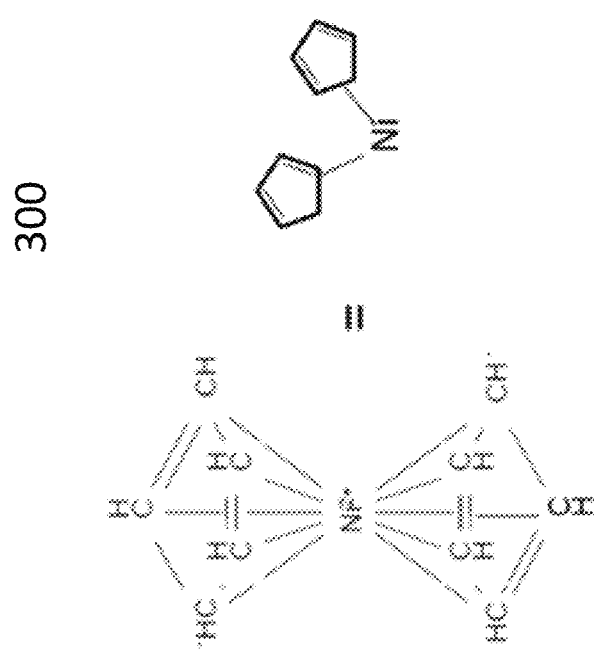
FIG. 3 is a diagram of a nickel dicyclopentadienyl molecule ($Ni(C_5H_5)_2$, which may be abbreviated as $Ni(Cp)_2$, and which may function as a precursor to be utilized in fabrication of correlated electron materials according to an embodiment.

FIG. 3 is a diagram of a nickel dicyclopentadienyl molecule ($Ni(C_5H_5)_2$), which may be abbreviated as $Ni(Cp)_2$, and which may function as a precursor to be utilized in fabrication of correlated electron materials according to an embodiment 200 (detailed in 400) or 260. As shown in FIG. 3, a nickel atom, near the center of the nickel dicyclopentadienyl molecule, has been placed in an ionization state of +2 to form an $N^{2+}$ ion. In the example molecule of FIG. 3, an additional electron is present in the upper left and lower right CH⁻ sites of the cyclopentadienyl (Cp) portions of the dicyclopentadienyl ((Cp)$_2$) molecule. FIG. 3 additionally illustrates a shorthand notation showing nickel bonded to pentagon-shaped monomers of a dicyclopentadienyl molecule. As mentioned previously herein, a mixture of Ni(Cp)$_2$ and O3 may be utilized as gaseous precursors in an atomic layer deposition process utilized to fabricate a CEM device.

FIGS. 4A-4L show sub-processes utilized in a method for fabricating a film comprising a CEM according to an embodiment. The sub-processes of FIGS. 4A-4L may correspond to the atomic layer deposition process utilizing precursors AX and BY of expression (6) to deposit components of NiO:CO onto a conductive substrate with control of the amount of incorporated dopant, such as CO by means of adjustment of the oxidizer species and/or flow rate.

However, the sub-processes of FIGS. 4A-4L may be utilized, with appropriate material substitutions, to fabricate films comprising CEM that utilize other transition metals, transition metal compounds, transition metal oxides, or combinations thereof, and claimed subject matter is not limited in this respect.

Figure 4A:
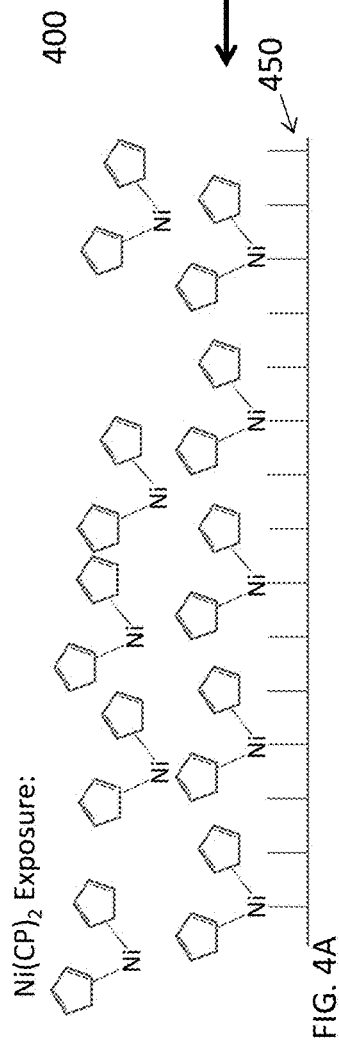

As shown in FIG. 4A, (embodiment 400) a substrate, such as substrate 450, may be exposed to a first gaseous precursor, such as precursor AX of expression (6a), which may comprise of gaseous nickel dicyclopentadienyl (Ni(Cp)$_2$), gaseous nickel amidinate (Ni(AMD)), and/or gaseous nickel 2-amino-pent-2-en-4-onato, for example, for a duration of approximately in the range of 1.0 seconds to 120.0 seconds. In an embodiment that accords with expression (6). As previously described, atomic concentration of a first gaseous precursor, as well as exposure time, may be adjusted so as to bring about a final atomic concentration of nitrogen in a fabricated correlated electron material of between approximately 0.1% and 10.0%, for example. However, the method to control the dopant concentration may be or also be the proper pairing of the oxidizer and/or the oxidizer flow as shown in FIG. 4C, FIG. 4G, and FIG. 4K.

As shown in FIG. 4A, exposure of a substrate to a mixture of gaseous nickel dicyclopentadienyl (Ni(Cp)$_2$), for example, may result in attachment of (Ni(Cp)$_2$) molecules at various locations of the surface of substrate 450. In embodiments, such attachment or deposition of Ni(Cp)$_2$ may take place in a heated chamber, which may attain, for example, a temperature approximately in the range of 20.0° C. to 400.0° C. However, it should be noted that additional temperature ranges, such as temperature ranges comprising less than approximately 20.0° C. and greater than approximately 400.0° C. are possible, and claimed subject matter is not limited in this respect.

Figure 4B:
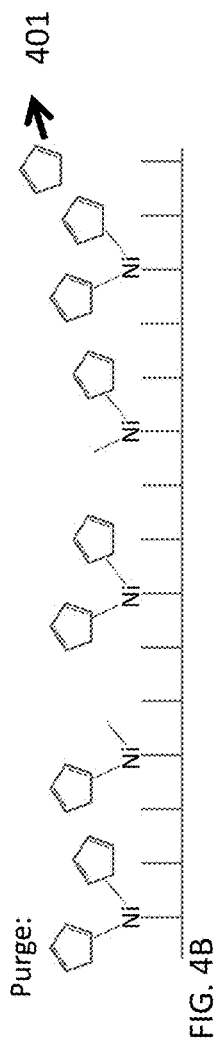

As shown in FIG. 4B, (embodiment 401) after exposure of a conductive substrate, such as conductive substrate 450, to gaseous precursors, such as a mixture of gaseous precursors comprising (Ni(Cp)$_2$), the chamber may be purged of remaining gaseous Ni(Cp)$_2$, Cp ligands, and other byproducts using purge gases such as nitrogen, argon, helium, or hydrogen as examples. In an embodiment, for the example of a gaseous precursor comprising a gaseous mixture of Ni(Cp)$_2$, the chamber may be purged for duration approximately in the range of 5.0 seconds to 180.0 seconds. In one or more embodiments, a purge duration may depend, for example, on affinity (aside from chemical bonding) of unreacted ligands and/or other byproducts, a transition metal oxide, or the like. Thus, for the example of FIG. 4B, if unreacted (Cp)$_2$ molecules were to exhibit an increased affinity for Ni, a larger purge duration may be utilized to remove remaining gaseous ligands, such as Cp ligands. In other embodiments, purge duration may depend, for example, on gas flow within the chamber. For example, gas flow within a chamber that is predominantly laminar may permit removal of remaining gaseous ligands at a faster rate, while gas flow within a chamber that is predominantly turbulent may permit removal of remaining ligands at a slower rate. It should be noted that claimed subject matter is intended to embrace purging of remaining gaseous material without regard to flow characteristics within a chamber, which may increase or decrease a rate at which gaseous material is removed.

Figure 4C:
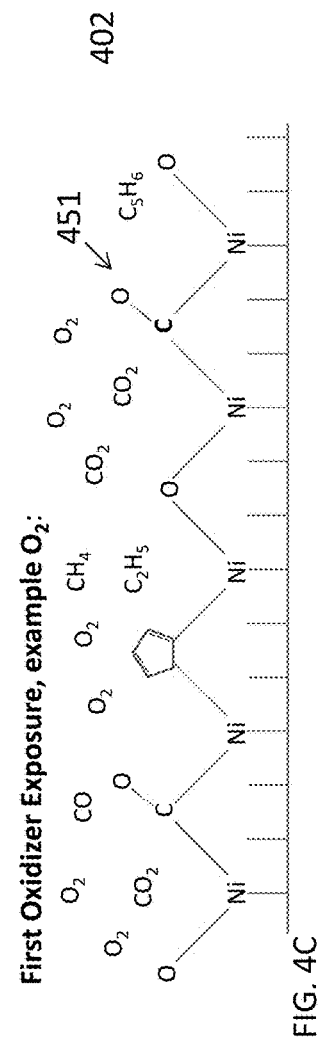

As shown in FIG. 4C, (embodiment 402) a second gaseous precursor, such as precursor BY of expressions (6) may be introduced into the chamber. As previously mentioned, a second gaseous precursor may comprise an oxidizer, which may operate to displace a first ligand, such as (Cp)$_2$, for example, and replace the ligand with an oxygen and in some cases the dopant ligand, such as CO (embodiment 451). Accordingly, as shown in FIG. 4C, oxygen atoms may form bonds with at least some nickel atoms bonded to substrate 450 in addition to incorporate a relatively small number of CO, for example. In an embodiment, precursor BY may oxidize (Ni(Cp)$_2$) to form a number of additional oxidizers, and/or combinations thereof, in accordance with expression (7) below:

Ni(C$_5$H$_5$)$_2$+O$_2$→NiO+potential byproducts (e.g., CO, CO$_2$, C$_5$H$_5$, C$_5$H$_6$, CH$_3$, CH$_4$, C$_2$H$_5$, C$_2$H$_6$, NH$_3$ . . . ) 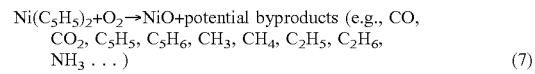 (7)

Wherein C$_5$H$_5$ has been substituted for Cp in expression (7). In accordance with FIG. 4C, a number of potential byproducts are shown, including C$_2$H$_5$, CO$_2$, CH$_4$, and C$_5$H$_6$. As is also shown in FIG. 4C, carbonyl, (CO) may remain bonded to nickel oxide complexes, such as at sites 451 in 402, for example. In embodiments, such nickel-to-carbonyl bonds (e.g., NiO:CO), in an atomic concentration of between, for example, 0.1% and 10.0% in a fabricated CEM device, may permit electron back donation which may bring about the substantially rapid conductor/insulator transition of a CEM device.

Figure 4D:
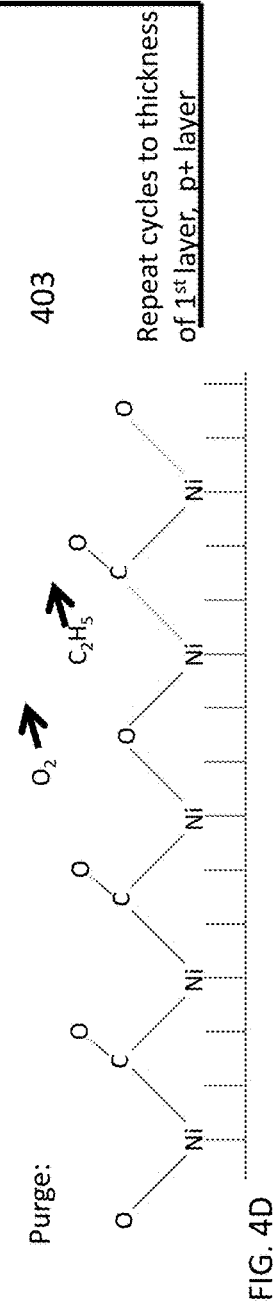
Figure 4I:
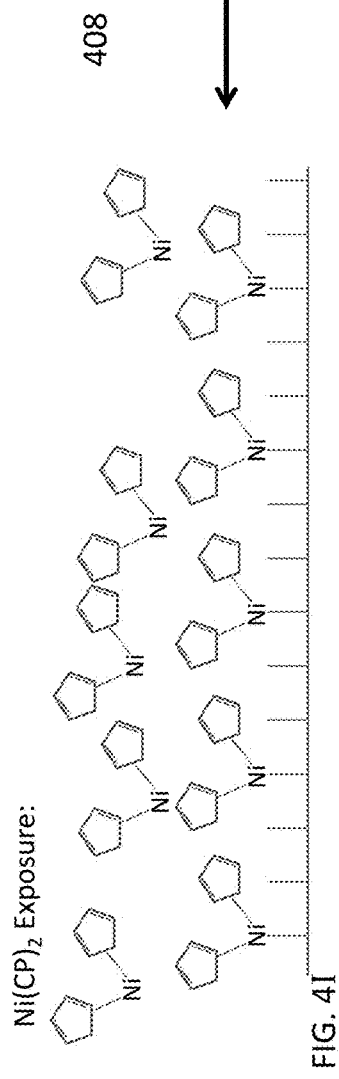
Figure 4J:
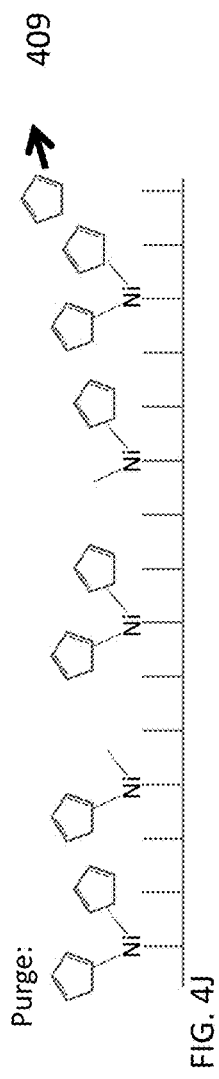
Figure 4K:
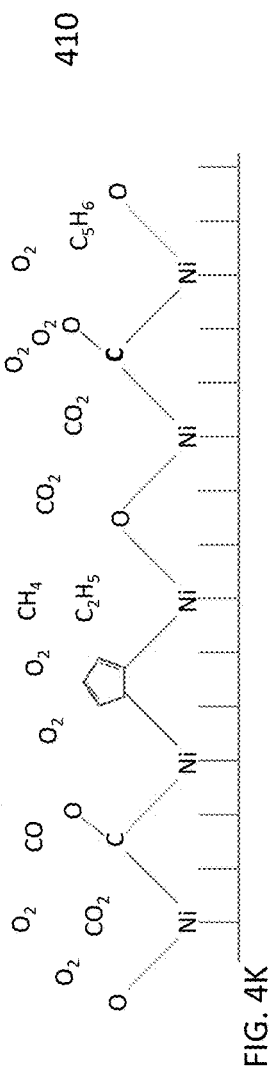
Figure 4L:
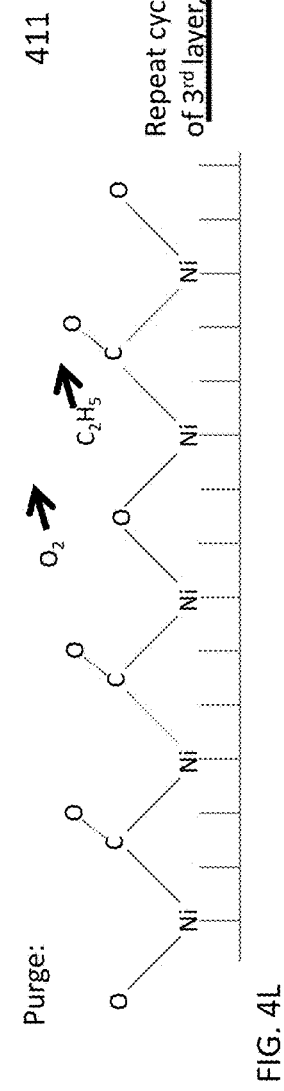

As shown in FIG. 4D, (embodiment 403) potential hydrocarbon byproducts, such as CO, CO$_2$, C$_5$H$_5$, C$_5$H$_6$, CH$_3$, CH$_4$, C$_2$H$_5$, C$_2$H$_6$, for example, may be purged from the chamber. In particular embodiments, such purging of the chamber may occur for a duration approximately in the range of 5.0 seconds to 180.0 seconds utilizing a pressure approximately in the range of 0.25 Pa to 100.0 kPa.

In particular embodiments, the sub-processes described shown in FIGS. 4A-4D may be repeated until a desired thickness of correlated electron material, such as a thickness approximately in the range of 5 nm to 50 nm, is achieved. As previously mentioned herein, atomic layer deposition approaches, such as shown and described with reference to FIGS. 4A-4D, for example, may give rise to a CEM device film comprising a thickness approximately in the range of 0.6 Å to 1.5 Å per each ALD cycle, for example. Accordingly, to construct a CEM device film comprising a thickness of 500.0 Å just as a possible example, approximately 300 to 900 two-precursor cycles, utilizing AX$_{gas}$+BY$_{gas}$ for example, may be performed. The set of steps outlined in FIG. 4A-4D may be repeated as necessary to deposit the thickness required for the outer doped region such as shown in FIG. 1C, embodiments 133.

FIG. 4E-4H, similar to 4A-4D except the conditions are adjusted including; but not limited to the pairing of the AX, transition metal, precursor such as Ni(Cp)2 or other; and the oxidizer such as O3 (instead of O2). The method here describes the ability of the relative reactivity of AX+BY in steps 4E-4H compared to 4A-4D allows one skilled in the art to control the dopant, such as carbonyl (CO) and provide a dopant concentration best suited to embodiment 132 of FIG. 1C. Steps 4I-4L represent the method to grow the outer layer, such as shown in FIG. 1C, embodiment 133 which may or may not be similar to steps 4A-4D.

In certain embodiments, cycles may be occasionally interspersed among differing transition metals and/or transition metal oxides to obtain desired properties. For example, in an embodiment, two atomic layer deposition cycles, in which layers of NiO:CO may be formed, may be followed by three atomic layer deposition cycles to form, for example, titanium oxide carbonyl complexes (TiO:CO). Other interspersing of transition metals and/or transition metal oxides is possible, and claimed subject matter is not limited in this respect.

In particular embodiments, after the completion of one or more atomic layer deposition cycles, a substrate may be annealed, which may assist in controlling grain structure. For example, if atomic layer deposition produces the number of columnar shaped grains, annealing may permit boundaries columnar-shaped grains to grow together which may, for example, reduce resistance and/or enhance electrical current capacity of the relatively impedance state of the CEM device, for example. Annealing may give rise to additional benefits, such as more evenly distributing of carbon molecules, such as carbonyl; for example, throughout the CEM device material, and claimed subject matter is not limited in this respect.

FIGS. 5A-5D are diagrams showing precursor flow and temperature profiles, as a function of time, which may be used in a method for fabricating correlated electron device materials according to an embodiment. A common timescale ($T_0 \to T_9$) is utilized for FIGS. 5A-5D. FIG. 5A shows a gas flow profile 510 for a precursor, such as gaseous AX, according to an embodiment 501. As shown in FIG. 5B, flow of one or more precursor gases may be increased, so as to permit the one or more precursor gases to enter a chamber within which a CEM device may be undergoing fabrication. Thus, in accordance with flow profile 510, at time $T_0$, flow of one or more precursor gases may comprise a relatively low value ($F_{Low}$), such as a flow of approximately 0.0, or other negligible amount. At time $T_1$, flow of one or more precursor gases may be increased to relatively higher value ($F_{high}$). At time $T_2$, which may correspond to a time approximately in the range of 1.0 seconds to 120.0 seconds after time $T_1$, precursor gases AX gas may be evacuated from the chamber, such as by purging, for example. A flow of precursor gases AX may be returned to a relatively low value, such as approximately 0.0, until approximately time $T_5$, at which time a flow of precursor gases AX may be increased to a relatively higher value ($F_{high}$). After time $T_5$, such as at times $T_6$ and $T_9$, a flow of precursor gases AX may be returned to relatively low value until increased at a later time.

FIG. 5B shows a gas flow profile 520 for a purge gas, according to an embodiment 502. As shown in FIG. 5B, purge gas flow may be increased and decreased so as to permit evacuation of the fabrication chamber of precursor gases AX and BY, for example. At time $T_0$, purge gas profile 520 indicates a relatively high purge gas flow, which may permit removal of impurity gases within the fabrication chamber prior to time $T_1$. At time $T_1$, purge gas flow may be reduced to approximately 0.0, which may permit introduction of precursor AX gas into the fabrication chamber. At time $T_2$, purge gas flow may be increased for duration of approximately in the range of 0.5 seconds to 180.0 seconds so as to permit removal of excess precursor gas AY and reaction byproducts from the fabrication chamber.

FIG. 5C shows a gas flow profile 530 for a precursor gas (e.g., BY), or 540 for a different gas, CZ, according to an embodiment 503. As shown in FIG. 5C, precursor BY gas flow may remain at a flow of approximately 0.0, until approximately time $T_3$, at which gas flow may be increased to relatively higher value. At time $T_4$, which may correspond to a time approximately in the range of 0.5 seconds to 180.0 seconds after time $T_3$, precursor BY gas may be purged and/or evacuated from the chamber, such as by purging, for example. Precursor BY gas flow may be returned to 0.0, until approximately time $T_7$, at which time precursor CZ gas flow may be increased to a relatively higher value. At time $T_8$, which may correspond to a time approximately in the range of 0.5 seconds to 180.0 seconds after time $T_8$, precursor CZ gas may be purged and/or evacuated from the chamber, such as by purging, for example. Precursor CZ gas flow may be returned to 0.0. Precursor BY and CZ are differentiated by their relative reactivity with the transition metal precursor and the ability to incorporate the dopant ligand, $L_x$.

At time $T_3$, purge gas flow may be decreased to relatively low value, such as approximately 0.0 m$^3$/sec, which may permit precursor BY gas to enter the fabrication chamber. After exposure of the substrate to precursor BY gas, purge gas flow may again be increased so as to permit removal of precursor BY gas from the fabrication chamber, which may signify completion of a single atomic layer of a CEM device film, for example. After removal of precursor BY gas, precursor AX gas may be reintroduced to the fabrication chamber so as to initiate a deposition cycle of a second atomic layer of a CEM device film. In particular embodiments, the above-described process of introduction of precursor AX gas into the fabrication chamber, purging of remaining precursor AX gas from the fabrication chamber, introduction of precursor BY gas, and purging of remaining precursor BY gas, may be repeated, for example, approximately in the range of 300 times to 900 times, for example. Repetition of the above-described process may bring about CEM device films having a thickness dimension of, for example, between approximately 20.0 nm and 100.0 nm, although claimed subject matter is not limited in this regard. The number of cycles of AX+BY followed by the AX+CZ followed by AX+BY allows the formation of the embodiment shown in FIG. 1C. The transition metal precursor, such as AX, for example Ni(CP)2 may also change such that the transition is several cycles of AX+BY followed by several cycles of DV+CZ followed by AX+BY, for example DV may be comprised of a different transition metal, titanium for example, and/or different ligands on the precursor such as ethyl or methyl ligands substituted for some or all of the cyclopentadienyls for example.

FIG. 5D is a diagram showing a temperature profile, as a function of time, used in a method for fabricating correlated electron device materials according to an embodiment. In FIG. 5D, a deposition temperature may be raised to attain a temperature of, for example, a temperature approximately in the range of 20.0° C. to 900.0° C. However, in particular embodiments, somewhat smaller ranges may be utilized, such as temperature ranges approximately in the range of 100.0° C. to 800.0° C. Further, for particular materials, even smaller temperature ranges may be utilized, such as from approximately 100.0° C. to approximately 600.0° C.

FIGS. 5E-5H are diagrams showing precursor flow and temperature profiles, as a function of time, which may be used in a method for fabricating correlated electron device materials according to an embodiment. A common timescale ($T_0$-$T_7$) is utilized for FIGS. 5E-5H. As shown in embodiment 505 (FIG. 5E), precursor AX may be brought into a fabrication chamber at time $T_1$, where time $T_0$ to time $T_1$ represent a period during which a process chamber may be purged and/or evacuated utilizing an increased purge gas flow, such as shown by purge gas profile 550 (e.g., embodiment 506 as shown in FIG. 5F), in preparation for material deposition. Profile 540 indicates a relative increase in flow of precursor AX to occur at time $T_1$. Also at time $T_1$, flow of a second reactant precursor, BY, may be increased, as shown in gas profile 560 (e.g., embodiment 507, as shown in FIG. 5G) in which gas flow may be increased at $T_1$. Two precursors (AX+BY or AX+CZ) may flow substantially at the same time for an amount of time consumed for the thickness of a single CEM film layer until time $T_2$ at which BY flow will be reduced, at time $T_3$ which may be greater than or equal to $T_2$ and precursor CZ will be increased to a relatively high flow until time $T_4$ at which time the flow rate of CZ will be reduced and precursor BY flow rate will be increased until time $T_6$. The temperature profile shown in FIG. 5H (e.g., embodiment 508) shows the temperature for deposition is set before or near time $T_0$.

FIGS. 6A-6C are diagrams showing temperature profiles, as a function of time, used in deposition and annealing processes for fabricating CEM devices according to an embodiment. As shown in FIG. 6A (embodiment 600), deposition may take place during an initial time span, such as from $T_0$ to $T_{1m}$. From $T_0$ to $T_{1m}$, a CEM device film may be deposited upon an appropriate substrate utilizing an atomic layer deposition process, for example. After deposition of a CEM device film, an annealing period may follow. In some embodiments, a number of atomic layer deposition cycles may range from, for example, approximately 10 cycles, to as many as 1000 cycles or more, and claimed subject matter is not limited in this respect. After completion of deposition of a CEM film onto a suitable substrate, relatively high-temperature annealing or an annealing at a similar temperature range or lower temperature range than the deposition temperature may be performed. In some embodiments, and annealing process may utilize a temperature approximately in the range of 20.0° C. to 900.0° C., and occur from time $T_{1n}$ to time $T_{1z}$. However, in particular embodiments, smaller ranges may be utilized, such as temperature ranges approximately in the range of 100.0° C. to 800.0° C. Further, for particular materials, even smaller temperature ranges may be utilized, such as from approximately 200.0° C. to approximately 600.0° C. Annealing times may range from approximately 1.0 second to approximately 5.0 hours, but may be narrowed to, for example, durations of approximately 0.5 minutes to 180.0 minutes. It should be noted that claimed subject matter is not limited to any particular temperature ranges for annealing of CEM devices, nor is claimed subject matter limited to any particular durations of annealing. In other embodiments the deposition method may comprise chemical vapor deposition, physical vapor deposition, sputter, plasma enhanced chemical vapor deposition or other methods of deposition or combinations of deposition methods such as a combination of ALD and CVD to form a CEM film.

In embodiments, annealing may be performed in a gaseous environment comprising one or more of gaseous nitrogen ($N_2$), hydrogen ($H_2$), oxygen ($O_2$), water or steam ($H_2O$), nitric oxide (NO), nitrous oxide ($N_2O$), nitrogen dioxide ($NO_2$), ozone ($O_3$), argon (Ar), helium (He), ammonia ($NH_3$), carbon monoxide (CO), methane ($CH_4$), acetylene ($C_2H_2$), ethane ($C_2H_6$), propane ($C_3H_8$), ethylene ($C_2H_4$), butane ($C_4H_{10}$), or any combination thereof.

As shown in FIG. 6B (embodiment 601), deposition may take place during an initial time span, such as from $T_0$ to $T_{2m}$, during which between approximately 10 and approximately 500 cycles of atomic layer deposition may be performed. At time $T_{2n}$, an annealing period may be initiated and may continue until time $T_{2z}$. After time $T_{2z}$, a second set of atomic layer deposition cycles may occur, perhaps numbering between approximately 10 and approximately 500 cycles, for example. As shown in FIG. 6B, a second set of atomic layer deposition (Deposition-2) cycles may occur at a slightly higher temperature than a first set of atomic layer deposition cycles (Deposition-1).

As shown in FIG. 6C, (embodiment 602) deposition may take place during an initial time span, such as from time $T_0$ to time $T_{3m}$, during which between approximately 10 and approximately 500 cycles of atomic layer deposition may be performed. At time $T_{3n}$, a first annealing period (Anneal-1) may be initiated and may continue until time $T_{3z}$. At time $T_{3j}$ a second set of atomic layer deposition cycles (Deposition-2) may be performed until time $T_{3k}$, at which a chamber temperature may be increased so that a second annealing period (Anneal-2) may occur, such as beginning at time $T_{3l}$, for example.

As used herein, the term "substrate" may include, bare silicon, silicon-on-insulator (SOI) or silicon-on-sapphire (SOS) technology, doped and/or undoped semiconductors, epitaxial layers of silicon supported by a base semiconductor foundation, complementary metal oxide semiconductors (CMOS), such as a CMOS front end with a metal backend, and/or other semiconductor structures and/or technologies, including CEM devices, for example. In embodiments, a substrate may comprise a group III-nitride such as aluminum nitride or gallium nitride; or group III-V materials such as gallium arsenide, indium phosphide or others; or other group IV materials such as Ge, graphene, diamond or silicon carbide or combinations thereof. A substrate may also comprise a metal film (such as titanium nitride, copper, aluminum, cobalt, nickel, or other materials); or carbon nanotubes or carbon nanotube clusters; or other conducting materials such as ruthenium oxide or other conducting oxides upon which the CEM may be deposited. Various circuitry, such as driver and/or decode circuitry, for example, associated with operating a programmable memory array, for example, may be formed in and/or on a substrate. Furthermore, when reference is made to a "substrate" in the following description, previous process steps may have been utilized to form regions and/or junctions in the base semiconductor structure or foundation.

In an embodiment, CEM devices may be implemented in any of a wide range of integrated circuit types. For example, numerous CEM devices may be implemented in an integrated circuit to form a programmable memory array, for example, that may be reconfigured by changing impedance states for one or more CEM devices, in an embodiment. In another embodiment, programmable CEM devices may be utilized as a non-volatile memory array, for example. Of course, claimed subject matter is not limited in scope to the specific examples provided herein.

A plurality of CEM devices may be formed to bring about integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. Also, in an embodiment, a first CEM device and a second CEM device, comprising impedance characteristics that differ from one another, may be formed within a particular layer of an integrated circuit. Further, in an embodiment, forming the first and second CEM devices within a particular layer of an integrated circuit may include forming the CEM devices at least in part by selective epitaxial deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:
1. A film deposited on a substrate, comprising:
a correlated electron material comprising a carbon-based material as an electron back-donating material, in an atomic concentration of carbon between 0.1% and 10.0%, the film having an approximate thickness of between 1.5 nm and 150.0 nm and exhibiting a ratio of a first resistance state to a second resistance state of at least 5.0:1.0 when a voltage of between of 0.1 V and 10.0 V is applied across a thickness dimension of the film.
2. The film according to claim 1, wherein the correlated electron material comprises a thickness of between 10.0 nm and 50.0 nm and exhibits a ratio of a first resistance state to a second resistance state of at least 5.0:1.0 when a voltage of between 0.6 V and 1.5 V is applied across a thickness dimension of the film.

3. The film according to claim 1, wherein the correlated electron material comprises between 10 and 1000 atom layers.
4. The film according to claim 1, wherein the carbon-based material provides for p-type doping of the correlated electron material film.
5. The film according to claim 1, wherein the correlated electron material film comprises a switching region of correlated electron material disposed between a first relatively conductive region of correlated electron material and a second relatively conductive region of correlated electron material.
6. The film according to claim 5, wherein the switching region has an atomic concentration of carbon less than that of each of the first and the second relatively conductive regions.
7. The film according to claim 5, wherein the switching region exhibits a first impedance state and the conductive regions exhibit a second impedance state, and wherein the first impedance state and the second impedance are substantially dissimilar from one another.
8. The film according to claim 1, wherein the correlated electron material film comprises a transition metal or a transition metal oxide.
9. The film according to claim 1, wherein the correlated electron material film comprises at least one first atom layer of correlated electron material interspersed between at least two second atom layers of correlated electron material, and wherein the at least one first atom layer of correlated electron material comprises a transition metal or a transition metal oxide which is different from that of the correlated electron material of the at least two second atom layers.
10. The film according to claim 1, wherein the correlated electron material comprises nickel oxide and the carbon-based material comprises carbonyl ligand.
11. A switching device, comprising:
a correlated electron material film comprising a carbon-based material as an electron back-donating material in an atomic concentration of carbon of between 0.1% and 10.0%, the correlated electron material film being disposed between two or more conductive electrodes, the correlated electron material having a thickness of between 1.0 nm and 150.0 nm and exhibiting a ratio of a first resistance state relative to a second resistance state of at least 5.0:1.0 when a voltage of between 0.1 V and 10.0 V is applied across at least two of the two or more conductive electrodes.
12. The switching device according to claim 11, wherein the correlated electron material film comprises a thickness of between 10.0 nm and 50.0 nm and exhibits a ratio of a first resistance state relative to a second resistance state of at least 5.0:1.0 when a voltage of between 0.6 V and 1.5 V is applied across at least two of the two or more conductive electrodes.
13. The switching device according to claim 11, wherein one or more of the conductive electrodes comprise titanium nitride, platinum, titanium, copper, aluminum, cobalt, nickel, tungsten, tungsten nitride, cobalt silicide, ruthenium oxide, chromium, gold, palladium, indium tin oxide, tantalum, silver or iridium, or any combination thereof.
14. The switching device according to claim 11, wherein the carbon-based material provides for p-type doping of the correlated electron material film.
15. The switching device according to claim 11, wherein the correlated electron material film comprises a switching region of correlated electron material disposed between a first relatively conductive region of correlated electron material and a second relatively conductive region of correlated electron material.

16. The switching device according to claim 15, wherein the switching region has an atomic concentration of carbon less than that of each of the first and the second relatively conductive regions.

17. The switching device according to claim 15, wherein the switching region exhibits a first impedance state and the conductive regions exhibit a second impedance state, and wherein the first impedance state and the second impedance are substantially dissimilar from one another.

18. The switching device according to claim 11, wherein the correlated electron material film comprises a transition metal or a transition metal oxide.

19. The switching device according to claim 11, wherein the correlated electron material film comprises at least one first atom layer of correlated electron material interspersed between at least two second atom layers of correlated electron material, and wherein the at least one first atom layer of correlated electron material comprises a transition metal or a transition metal oxide which is different from that of the correlated electron material of the at least two second atom layers.

20. The switching device according to claim 11, wherein the correlated electron material film comprises nickel oxide and the carbon-based material comprises carbonyl ligand.

\* \* \* \* \*